United States Patent [19]
Zimmerman

[11] Patent Number: 5,370,553
[45] Date of Patent: Dec. 6, 1994

[54] ADJUSTABLE TERMINATIONS IN EQUIPMENT HOUSING FOR CABLES

[75] Inventor: Joel A. Zimmerman, Parsippany Township, Morris County, N.J.

[73] Assignee: AT&T Corp., Murray Hill, N.J.

[21] Appl. No.: 30,938

[22] Filed: Mar. 12, 1993

[51] Int. Cl.5 .......................................... H01R 13/60
[52] U.S. Cl. ................. 439/534; 174/99 R; 361/827
[58] Field of Search ............. 439/534, 563, 573, 207; 174/99 R, 100; 361/610, 724, 826, 827

[56] References Cited

U.S. PATENT DOCUMENTS 4,288,838  9/1981  Van Der Vegte et al. ..... 361/827 X

FOREIGN PATENT DOCUMENTS

60-22776  2/1985  Japan .................................. 439/534

Primary Examiner—Eugene F. Desmond
Attorney, Agent, or Firm—Ruloff F. Kip, Jr.

[57] ABSTRACT

A housing for telecommunications equipment has therein a vertical passageway extending in said housing alongside racks for holding such equipment and between upper and lower entry ways provided by said housing to admit into said passageway from either above or below one or more external cables for servicing equipment in the racks. For each rack there is a flexible extension cable having a front end with a coaxial fitting thereon disposed in the passageway and running from such front end to the corresponding rack to there be coupled with a cable receptor connector. The coaxial fitting on each extension cable is coupleable to an end coupling on the free end of a corresponding external cable. The coaxial fitting on each extension is mounted on a rockable platform pivotally supported from the corresponding rack and angularly selectably adjustable between and secured at two positions of the platform at which the fitting thereon points, respectively, upwardly and downwardly.

14 Claims, 4 Drawing Sheets

ADJUSTABLE TERMINATIONS IN EQUIPMENT HOUSING FOR CABLES

FIELD OF THE INVENTION

This invention relates generally to housings for accommodating electrical equipment adapted to be served by one or more electric cables originating externally of the housing and admitted from outside of to inside the housing to there terminate and be electrically coupled to said equipment when installed. More particularly, this invention relates to housings of such kind having upper and lower entry ways to facilitate admission of such one or more cables into the housing, when they originally lie above and below it, respectively.

BACKGROUND OF THE INVENTION

Housings of the son described are designed to be installed in rooms in which the one or more cables which terminate in the housing may approach it either from above the housing (as, say, in ducts above the ceiling of the room) or from below the housing (as, say, in ducts below the room's floor). Since it is often not possible to predict in advance whether a particular housing will be installed in a room where the cable or cables to end at the housing will approach it from above or below, it has been a common practice to have housings of two different designs to meet those two contingencies. That is, past housings have commonly been either of a first design having only an upper entry way for admitting a cable approaching from above, and extending down into the housing to a free end or, alternatively, of a second design having only a lower entry way for admitting a cable approaching the housing from below and extending upwardly into the housing to a free end.

Housings of either the first design or the second design have included as a feature a cable receptor connector to which the free end of the admitted cable was mechanically coupled in order to electrically couple the cable to equipment in the housings. Such receptor connector differed, however, for the two designs in that, in housing with upper entry ways and lower entry ways, respectively, the connector from its support extended vertically upwards and downwards, respectively, in the first and second of such designs. By thus having such receptor connector point in each case more or less towards the entry of the housing through which the cable will be admitted, the free end of the cable can be coupled to the connector while avoiding or reducing to acceptable value any bend necessarily made in the cable in order to effect such coupling. In such matter, it is to be noted that a cable of the sort described is often quite stiff and cannot be flexed to have a bending radius of less than a minimum critical size without doing damage to the cable.

While the providing of housings of two different designs for receiving cables respectively overlying and underlying the housing on their approaches thereto is a scheme which is technically feasible, that way of doing things is inefficient costwise since it requires the manufacturing and keeping in stock of two different designs of housings which could be identical in design and, thus, of lesser cost per unit, if the matter of whether the cables leading thereto came from above or below the housing is a consideration which could be disregarded.

SUMMARY OF THE INVENTION

The aforementioned disadvantage of housings using separate designs for cables approaching from above and below is avoided according to the invention in one of its aspects by providing housings for equipment having both upper and lower entry ways in the same housing to adapt it to have a cable approaching the housing from either above or below admitted into through, respectively, the upper entry way or the lower entry way, and by providing in the housing a receptor connector and means in the housing permitting the free end of the admitted cable to be electrically coupled to that receptor connector without undue bending of the cable whether admitted through the upper entry or the lower entry way.

BRIEF DESCRIPTION OF THE DRAWING

For a better understanding of the invention, reference is made to the following description of a representative embodiment thereof, and to the accompanying drawings wherein.

In the description which follows, certain elements which are counterparts are designated by the same reference numeral but distinguished from each other by different alphabetical suffixes for those reference numerals, and it is to be understood that a description of any such element shall, unless the context otherwise indicates, be taken as also applicable to its counterparts.

DESCRIPTION OF DETAILS OF EMBODIMENT

Figure 1:
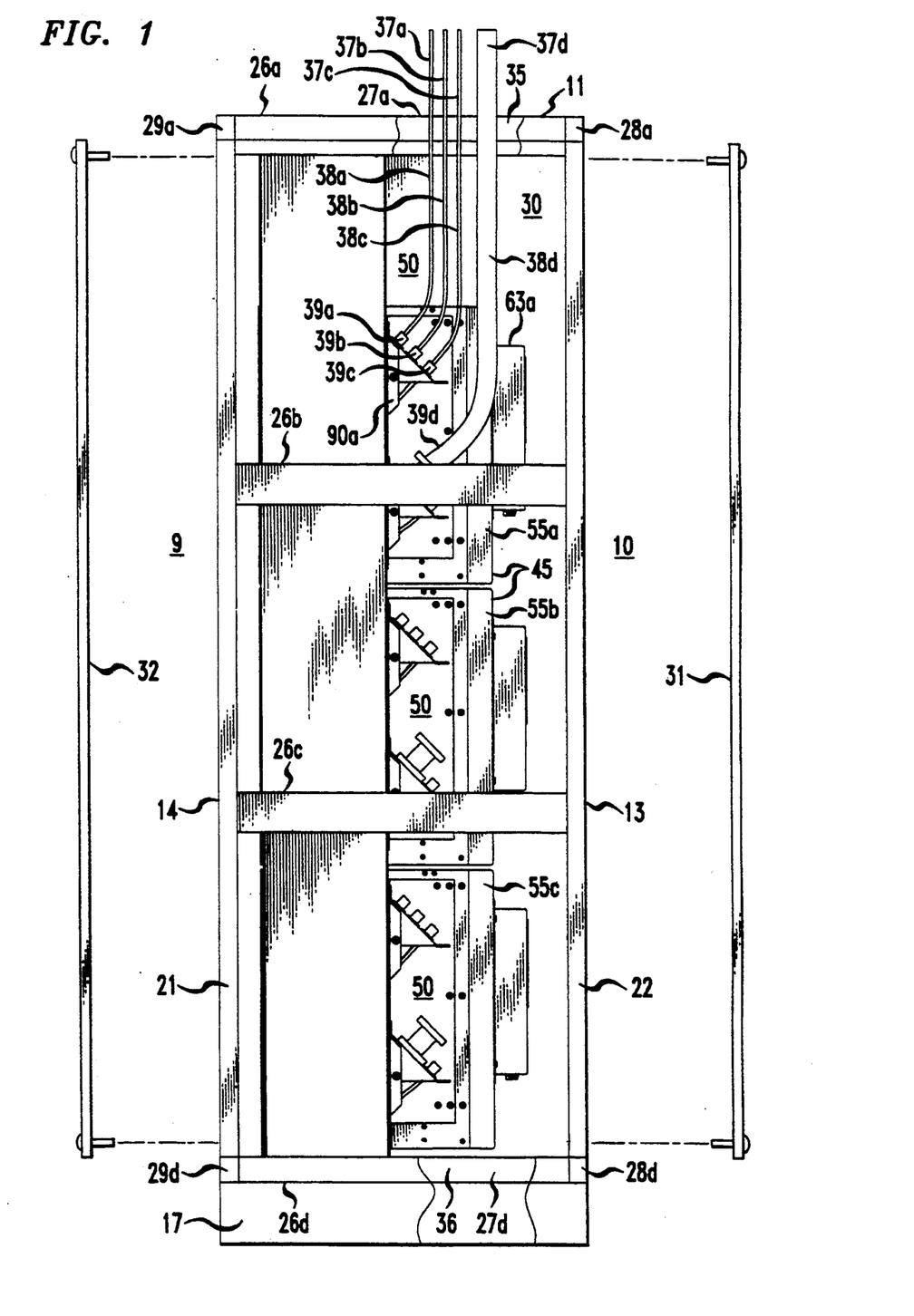
FIG. 1 is a left side elevation of apparatus according to the invention comprising a housing and racks therein for accommodating electrical equipment.

Referring now to FIG. 1, the reference numeral 9 designates apparatus which is an exemplary embodiment of the invention, and which comprises a housing comprising a vertically upstanding framework 10. Such framework is of rectangular shape both in horizontal cross-section and in vertical cross-section both laterally and longitudinally. The framework has a top 11, a bottom 12 and vertically extending sides disposed between such top and bottom and consisting of longitudinally-spaced front and back sides 13 and 14 (FIG. 1) and left and right sides 15 and 16 (FIG. 2) laterally spaced from each other. A pair of laterally spaced feet 17, 18 raise framework 10 above the floor on which it rests.

Figure 2:
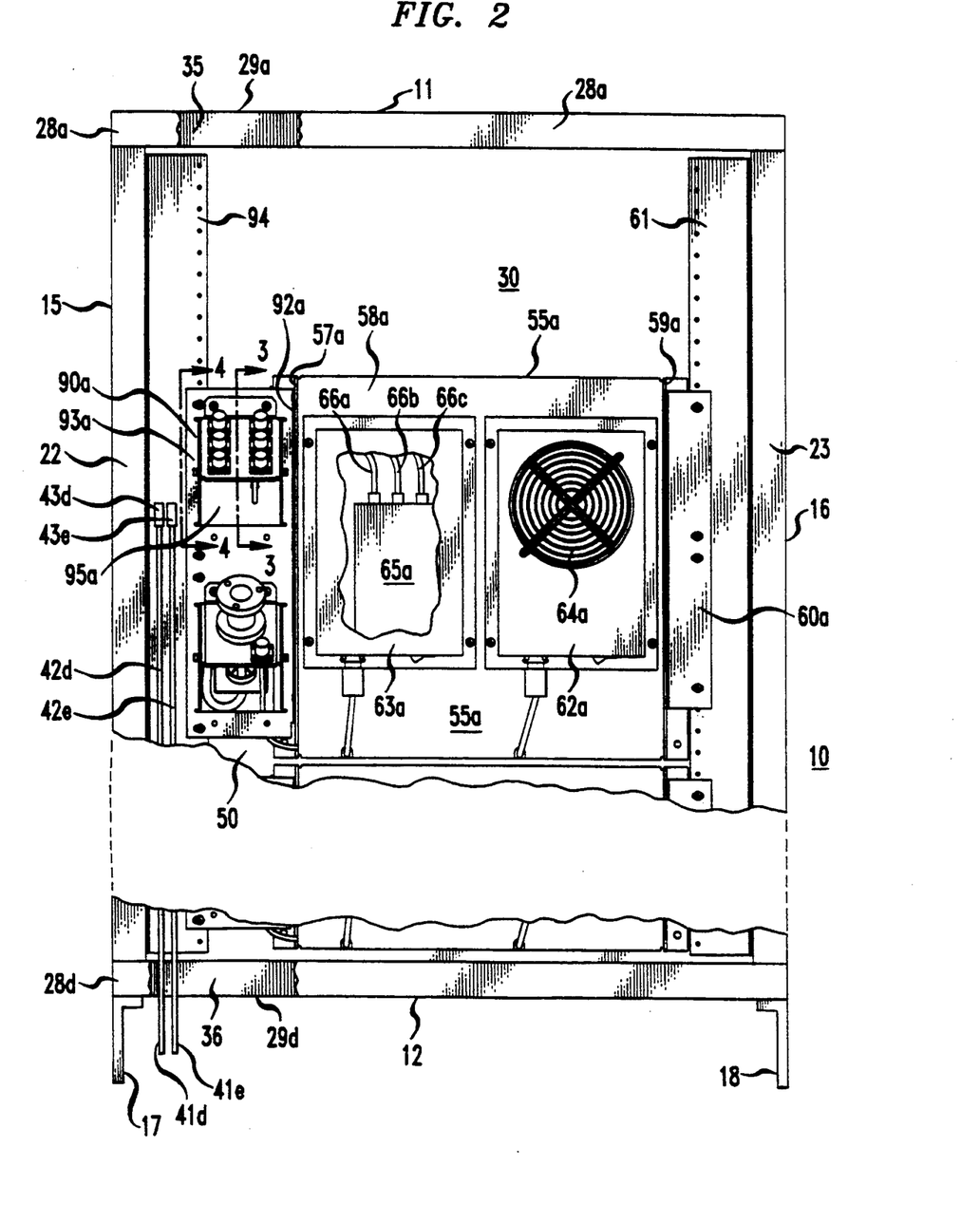
FIG. 2 is an enlarged broken-away front elevation view of the FIG. 2 housing showing the top rack in that housing.

The structure of the framework comprises four upright posts at its four corners. Three of such posts 21, 22, and 23 are shown in FIG. 1 and/or FIG. 2 while the other post 24 is hidden from view. The vertical posts 21 and 22 at the left side 15 of the framework are coupled together by vertically spaced horizontal longitudinally extending braces 26a–26d while a similar set of braces 27a–27d (of which braces 27a and 27d are shown) couple the posts 23, 24 at the right side 16 of the framework. At the framework's front 13, the posts 22, 23 are coupled together by a set of four vertically spaced horizontal laterally extending braces similar to the braces 26a–26d and 27a–27d, but of which only two braces 28a, 28d of these four laterally extending braces are shown in FIGS. 1 and 2, the others being broken away (FIG. 1). A similar set of four vertically spaced horizontal laterally extending braces couples together the posts 21 and 24 at the back side 14 of framework 10, two posts 29a, 29d of the four last braces being shown (FIGS. 1 and 2) while the remaining two posts are hidden from view (FIG. 1) or broken away (FIG. 2). All the braces described above are fixedly joined at their ends to the posts coupled thereby to provide a rigid structure by the framework 10.

The sides 13–16 of framework 10 are disposed around an interior space 30 thereof which, if desired, may be further enclosed by panels which are parts in addition to the framework of the mentioned housing and which are fastenable to the sides of the framework to provide enclosures for space 30. Two such panels 31 and 32 (FIG. 1) are fastenable to the front and back 13 and 14 of framework 10 to be carried thereby, and two other panels (not shown) are similarly fastenable to the left and right sides 15 and 16 of framework 10 to close in space 30 on those sides.

The top braces 26a–29a and bottom braces 26d–29d of framework 10 form two horizontal rectangular frames extending at the top 11 and bottom 12 of the framework around rectangular openings therein providing upper and lower entry ways 35 and 36, respectively, for the framework's interior space 30. While some of the area of those entry ways may be covered by screening (not shown), each of entry way 35 and 36 has at least a portion thereof which is adjacent to the left side 15 of framework 10, and which provides an unobstructed opening to the interior space 30.

In the use of apparatus 9, the entry ways 35 and 36 serve to conveniently permit admittance, at the top and bottom, respectively, of housing 10, of one or more cables originating outside the housing and approaching it, respectively from above and from below. Further details on this matter will be given later. For now, it is noted that FIG. 1 shows three such cables 37a, 37b and 37c, and a further large cable 37d, passing from above housing 10 and through entry way 35 from outside of to inside housing 10 so as to position in space 30 lengths 38a, 38b, 38c 38d of those cables terminating in respective coaxial end couplings 39a, 39b, 39c and 39d at the free ends of such cables. FIG. 2 has a similar showing of two cables 41d and 41e passing from below housing 10 through entry way 36 from outside of to inside housing 10 so as to position in space 30 respective lengths 42d and 42e of those cables terminating in respective coaxial end couplings 43d and 43e on the free ends of those cables.

The interior space 30 of housing 10 has therein a vertically upstanding container means 45 which is provided for holding equipment, and which is laterally spaced away from the left side 15 of the housing (FIG. 2) to provide between such housing's left side and the left side of such container means, a passageway 50 vertically extending between and communicating with both of the upper and lower entry ways 35 and 36. Within space 30, the longitudinal extent of passageway 50 is coextensive with that of the space itself (FIG. 1 ) whereas, in the lateral direction, the extent of passageway 50 is (FIG. 2) limited by the presence in space 30 of container means 45, the result being that the longitudinal extent of passageway 50 is greater than its lateral extent.

The container means 45 consists of a vertical plurality of racks 55a, 55b, 55c each adapted to hold in housing 10 equipment installed therein. Since all of such racks are similar in size, shape and function, only rack 55a will be described in detail.

The rack 55a is of rectangular prismatic shape in that it has a rectangular horizontal metallic bottom 56a and left, front and right rectangular vertical metallic walls 57a, 58a and 59a upstanding from such bottom, the back of rack 55a being open. Rack 55a does not rest on the rack 55b beneath it but, rather, is supported at its fight side by a bracket 60a, of "L" shape in horizontal cross section, having one of its sides fastened to the rack and its other side fastened to an upright right-hand "U" channel support post 61 in turn fastened to framework 10. The front wall 58a of the rack has formed therein two openings (not shown) ordinarily closed by fight and left hand removable covers 62a and 63a. As represented by the grilled vent 64a shown formed in cover 62a, both of covers 62a and 63a have such vents therein for fans (not shown) placed in rack 55a behind the vents. In the case of cover 63a, however, the region thereof which contains its vent has been broken away (FIG. 2) to permit viewing into the interior of the rack.

Taking advantage of that view, what is depicted as present in rack 55a is electrical equipment 65a which is represented schematically by the shown block to which numeral 65a refers, and which equipment is shown in FIG. 2 as being directly connected to, ends adjacent the equipment, of coaxial cables 66a, 66b, and 66c. The equipment 65a may comprise, for example, a backplane fixedly secured within rack 55a and, also, circuit packs which are provided by the rack with guideways within which the packs are slidable in and out to be selectively connectable and disconnectable from the back plane.

At this juncture, it is pointed out that, while the invention hereof includes in its scope apparatus comprising housing for all kinds of electrical equipment adapted to be served by cables which may be, say power conducting or signal transfer cables or both, the exemplary embodiment of the invention disclosed herein is apparatus in which the equipment 65a is telecommunications equipment and the various cables disclosed therein for serving that equipment are coaxial signal transfer cables having accessories which are suitable for that type of cable. Moreover ones of such disclosed cables are, for convenience, referred to herein as "field cables", but that term as used herein covers any kind of cable admitted from outside of to inside the apparatus 9 whether such cable extends to the apparatus from a remote region or from a nearby region, as, say, one in the same room.

Figure 3:
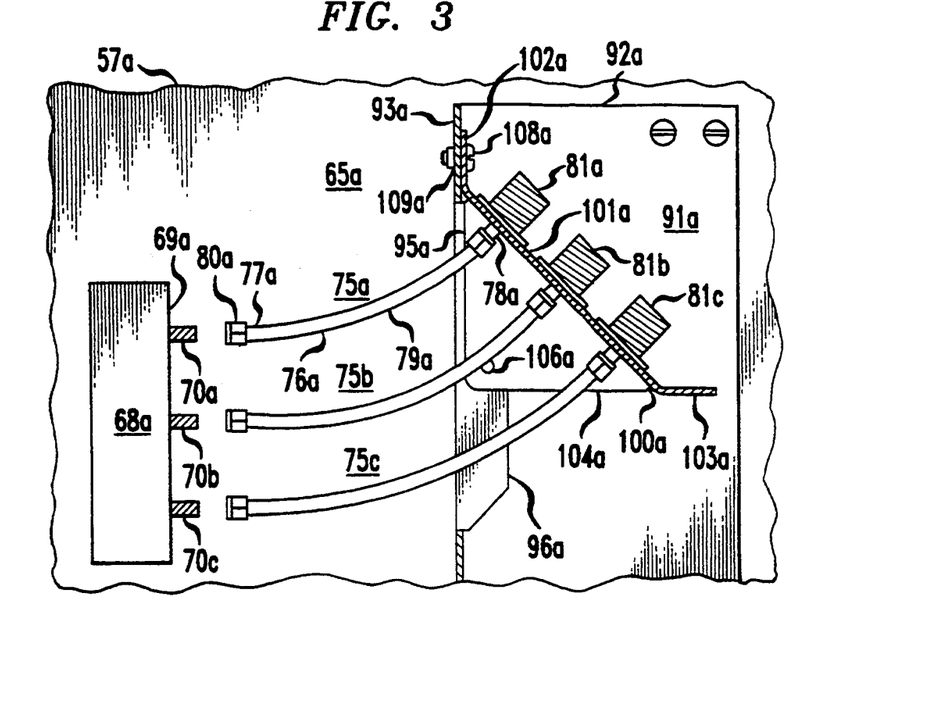
FIG. 3 is an enlarged broken-away left side elevation in cross section, taken as indicated by the arrows 3—3 in FIG. 2, of part of the top rack and of associated extension cables and adjustable support means for the front ends of such cables, such means having been adjusted so that those front ends point upwards.

Coming now to the matter of providing an electrical coupling of equipment 65a to one or more of such field cables, the wall 57a of rack 55a facing towards passageway 50 carries thereon a connection box 68a (FIG. 3)

fastened to the rack wall 57a and mounting on its front wall 69a a plurality of coaxial cable receptor connectors 70a, 70b, 70c fixedly secured in holes (not shown) in that front wall to project outside and inside the box, respectively, forwardly and rearwardly from that wall. The connectors 70a, 70b, 70c are conventional coaxial connectors which are connected rearwardly directly to the ends remote from equipment 65a of the coaxial cables 66a, 66b, 66c, respectively, to thereby be electrically connectable through those cables with equipment 65a when it is installed in rack 55a.

The three cable receptor connectors 70a, 70b, 70c have respectively associated therewith three cable extension means 75a, 75b, 75c which are counterparts of each other so that only the extension means 75a is described herein in detail. Such means is also sometimes referred to herein as a field cable extender or, merely, an extender.

The extension means 75a comprises a short coaxial extension cable 76a comprising a rear end 77a, a front end 78a, and a central portion 79a between those ends. The cable 76a is substantially more flexible than the field cables 37 and 41 led into housing 9. Such extension means also comprises first and second coaxial fittings 80a and 81a disposed at, and forming parts of, respectively, the rear end 77a and the front end 78a of the cable extension means.

Figure 4:
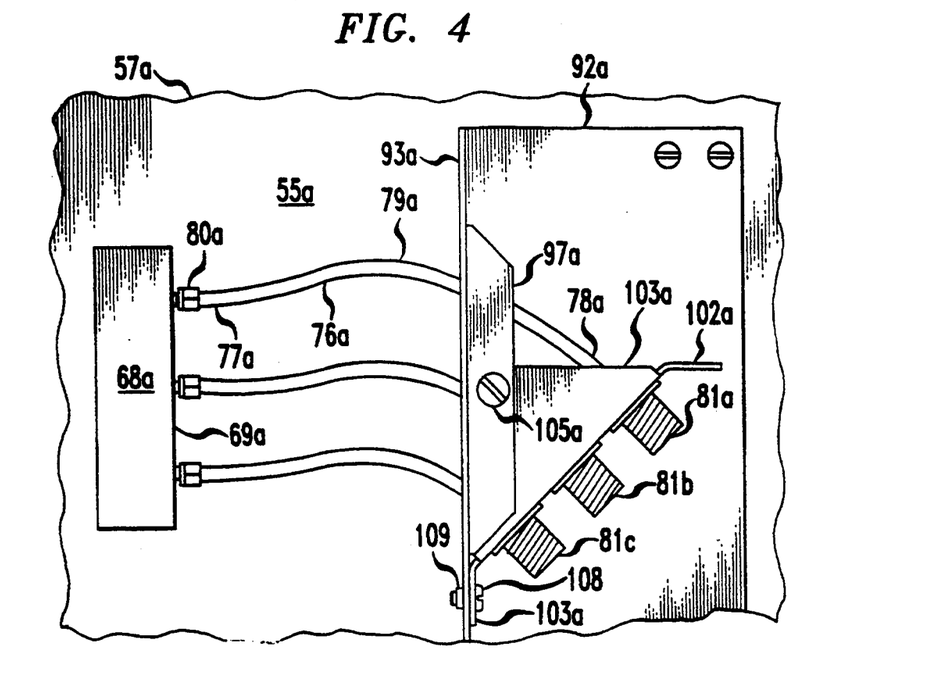
FIG. 4 is an enlarged left side elevation, taken as indicated by the arrows 4—4 in FIG. 2, of the FIG. 3 extension cables and support means therefor when such means is adjusted to cause the front ends of such cables to point downwards.

The fitting 80a on cable 76a and the cable receptor connector 70a are conventional coaxial devices of complementary designs to be selectively electromechanically connectable and disconnectable with each other. That is, the front end of connector 70a comprises an externally threaded electroconductive sleeve projecting from box 68a and a ring array of resilient fingers (not shown) coaxially disposed within that sleeve, the sleeve and fingers being electrically coupled to, respectively, the outer and inner conductors of the coaxial cable 66a. The end fitting 80a on cable 76a comprises, on the other hand, an outer rotatable electroconductive nut adapted by turning thereof to be screwed on connector 70a and, within such nut a projecting electroconductive pin (not shown) adapted when is so screwed on, to advance into contact with the mentioned fingers of connector 70a, the nut and pin of fitting 80a being coupled to, respectively, the outer and inner conductors of cable 76a. FIG. 3 shows the receptor connector 70a and the fitting 80a when they are disconnected from each other while FIG. 4 shows those same elements 70a and 80a when the fitting 80a has been manipulated to be electromechanically connected with the receptor connector 70a.

The fitting 81a on the front end of cable 76a is a coaxial device of the same type as the receptor connector 70a. That is, the fitting 81a comprises a projecting externally threaded electroconductive sleeve and an array of resilient electroconductive fingers coaxially disposed with such sleeve. The fitting 81a on cable 76a is adapted to be selectively electromechanically connected and disconnected with the coaxial end coupling 39a (FIG. 1) which is at the free end of field cable 37a, and which is the same type of coaxial device as fitting 70a so as, like it, to comprise a rotatable nut and a central projecting pin.

During use of the apparatus, the fitting 80a of cable 76a is fixedly secured relative to framework 10 by virtue of being electromechanically connected to receptor connector 70a. There is provided in the apparatus for the other fitting 81a of that extension cable an adjustable mounting means 90a now to be described.

Mounting means 90a comprises a bracket 91a made of a sheet metal piece bent into "L" shape in horizontal cross section, to have two panels 92a and 93a of which panel 92a is fastened to rack wall 57a while panel 93a projects laterally outwards from that wall into passageway 50 and vertically extends therein straight up and down. On its left side, back parcel 93a is fastened to an upright left hand "U" channel support beam 94 (FIG. 2) in turn fastened to framework 10.

The bracket panel 93a has formed therein a relatively large rectangular opening 95a passing from the front side of the panel rearwardly therethrough in the longitudinal direction. That opening 95a has laterally opposite margins at each of which the sheet metal of the bracket 91a is outturned from the lie of the panel to form at these margins two laterally spaced flanges 96a (FIG. 3) and 97a (FIG. 4) projecting longitudinally forwards from opening 95a.

Figure 6:
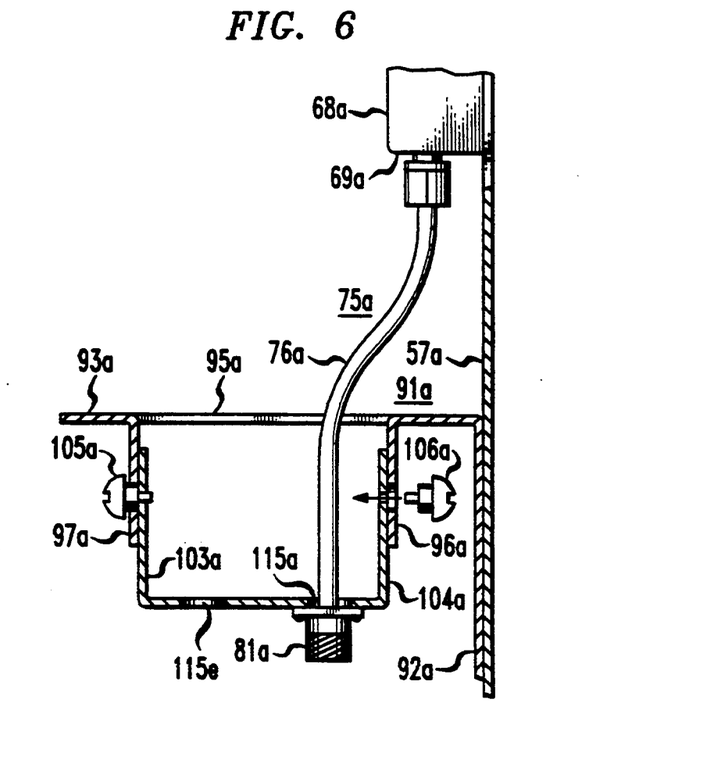
FIG. 6 is a plan view in cross-section, taken as indicated by the arrows 6—6 in FIG. 5, of the FIG. 3 extension cables and support means therefor.

The panel 93a of bracket 91a provides a backing and support for a rockable platform 100a constituting another component of mounting means 90a. Platform 100a comprises a central support web 101a of sheet metal generally rectangular in shape and having a top border strip 102a, a bottom border strip 103a and laterally spaced opposite sides extending between those strips. Integrally joined with those web sides are a pair of triangular arms 103a, 104 extending normal to and rearwardly from the web 101a so that the platform 100a is of square "U" shape in lateral cross section (FIG. 6). The arms 103a, 104a extend to vertex portions of those arms at which they are inside of and overlap with portions of the flanges 96a, 97a on opposite sides of the opening 95a in bracket 91a. At those overlapping portions, the rockable platform 100a of the mounting means 90a is pivotably coupled to the bracket 91a of that mounting means by a pair of pivot pins 105a, 106a defining a lateral pivot axis 107a for the platform.

The pins 105a, 106a have screw type heads outward of the flanges, reduced diameter threaded front ends received in, (and engaging the threading, of) corresponding threaded holes in the arms 103a, 104a of platform 100a, and intermediate diameter stem portions received with a free fit in journal holes formed in the flanges 96a, 97a to permit rocking of the platform 100a relative to the bracket 91a.

By virtue of such coupling of platform 100a through pins 105a, 106a to the platform's backing 93a, the platform, by angular movement thereof about axis 107a, is adjustable between first and second positions of which, respectively, the top strip 102a and the bottom strip 103a of the platform web 101a make contact with that backing. To permit both of such contacts to be a flush contact, the sheet metal of which platform web 101a is made is bent at the top and bottom thereof to cause its top and bottom strips 102a, 103a to be at an obtuse angle to the central portion of the web causing those strips to each lie flat against the backing 93a when making contact therewith. When platform 100a has been adjusted to its first position at which the top of web 101a contacts its backing, the platform can be secured in that first position by passing bolts 108a through holes in the webs top strip 102a and in the bracket 93a, and then screwing nuts 109a onto each bolt (FIG. 3). If, on the other hand, it is desired to secure platform 100a at its second position, this can be done by passing the same bolts 108 (or different bolts) through holes in the bottom strip 103a and matching holes in the backing 93a and then screwing nuts onto such bolts (FIG. 4). Evidently, if the platform is so secured by bolts at one of the platform's first and second positions, those bolts must be removed as a preliminary to shifting the platform to the other of such two positions.

Figure 5:
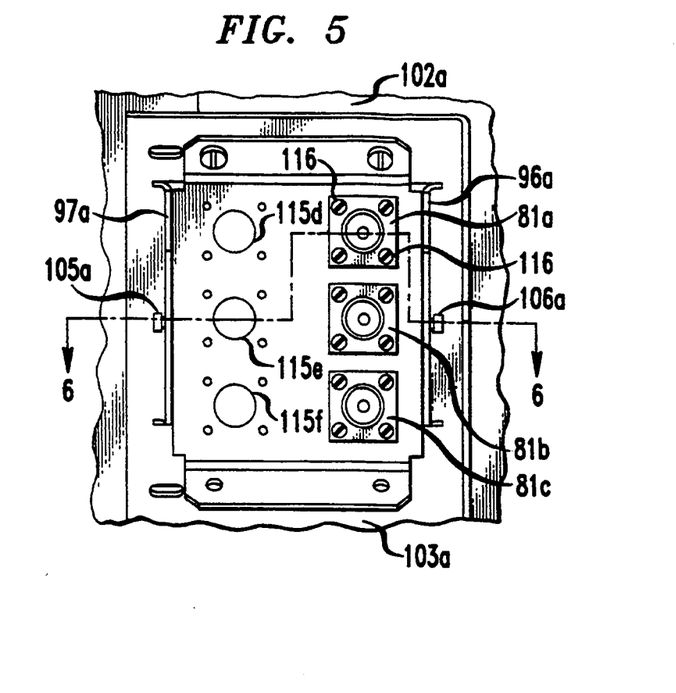
FIG. 5 is an enlarged front elevation of the FIG. 3 extension cables and support means therefor when such support means is in its position shown in FIG. 3.

The web 101a of the platform 100a serves as a carrier for the front ends of a plurality of cable extenders 75 having their front fittings 81 mounted on, and projecting outward from, the front side of the web. FIGS. 2 and 5 show that the web may carry the front ends of six such extenders with their front fittings 81 arranged in two columns of three each of such fittings. FIG. 5 differs from FIG. 2 in that in FIG. 5 the left hand column of fittings 81 has been removed (along with the extension cables 76 connected thereto) to show that those left hand fittings are mounted over corresponding circular apertures 115d, 115e, 115f formed in the web 101 to extend from its front side rearwardly therethrough. A corresponding set of apertures through web 101a lies beneath the front fittings 81a, 81b, 81c shown in FIG. 5. In connection with the foregoing, in the view shown in FIG. 4, the left hand column of front end fittings 81 and associated extension cables 76 has been removed (as in FIG. so that the fittings seen in FIG. 4 are the fittings 81a, 81b, 81c.

USE OF EMBODIMENT

The apparatus 9 as sold may come without installed field cable extenders 75, equipment 65 and other components for coupling a field cable or cables to such equipment. Assume that the apparatus is in that condition and has been placed in a room at the location desired for it. The extender 75a is installed in the apparatus as follows. With rear fitting 80a for the cable 76a of the extender 75a being removed and the extender being initially forwards of the platform 100a, the cable 76a is passed rearward through the aperture 115a in web 101a to bring the fitting 81a into contact with the web, and the fitting 81d is thereupon fastened thereto by screws 116. The rear fitting 80a for extender 75a is then attached to cable 76a. The remaining extenders 75 needed for that particular installation of apparatus 9 are then added to the apparatus in the same way as that just described for extender 75a. Assuming that an appropriate number of cable receptor connectors 70 are already fixed in place in housing 10, the rear fittings 80 of the cable extenders are electromechanically connected to those receptor connectors as earlier described.

At the particular site at which the apparatus 9 is being installed, the one or more external or field cables for serving the apparatus may run overhead thereto as, say, in ducts above the ceiling of the room in which the apparatus is. In that case, such one or more field cables are admitted, as exemplified by the shown cables 37a–37d (FIG. 1), through the upper entry way 35 for the housing 10 so as to position in the passageway 50 in that housing, for any such cable, a length 38 of that cable terminating in a free end and having an end coupling 39 on that end. If then, the rockable platform 100a is secured by bolts and nuts 108, 109 at its first position shown in FIG. 3, the platform is not moved and each end coupling 39 on each of the one or more field cables used is electromechanically connected as already described to a corresponding one of the fittings 81 mounted by the platform 100a. If however, platform is not initially at its FIG. 3 position, it is adjusted to that second position, is fastened at that position to backing panel 93a by bolts and nuts 108, 109 as earlier described, and the field cable coupling 39 are than electromechanically connected as described to the cable extender fittings 81. Field cables for equipment in racks 55 other than rack 55a are coupled in the same way through respective extenders 75 and rockable platforms 100 for those other racks.

When web 100a is in its FIG. 3 position, the front ends 78 of the cable extenders 75 mounted by the web (which front ends include fittings 81 ) extend upwardly from the central portions 79 of those extenders in the sense that the forward extensions of those front ends have a component in the upward direction in the vertical ordinate. To put it another way, those front ends 78 and fittings 81 point upwards in that sense. As a result of such front ends and fittings so extending or pointing upwards, when the end coupling 39 on the field cables 37 are electromechanically connected as described to the fittings 81 on the cable extenders, the bending thereby induced in the lengths 38 in passageway 50 of the cables 37 is a bending for which the smallest radius thereof is substantially greater than if those end couplings 39 had to be connected to coaxial connectors extending wholly horizontally (and, thus, in a neutral position for a housing having both upper and lower entry ways for field cables), and which smallest bend radius is greater than a minimum critical size therefor at which a field cable would be damaged by bending it to that critical size.

Assume, on the other hand, that, at the site at which the apparatus 9 is being installed, the one or more field cables for serving the apparatus approach it from below, as exemplified by cables 41d, 41e (FIG. 2)A, by, say, being led to it through ducts running below the floor of the room in which the apparatus is. In that latter case, if platform 100a is not initially secured at its second position shown in FIG. 3, it is adjusted to that position and secured thereat by bolts and nuts so that the front ends 78 and fittings of the cable extensions 75 extend or point downwardly in the sense mentioned. The one or more field cables 41 are then admitted through lower entry way 36 into the passageway 50 in housing 10 and are coupled to the appropriate cable extenders 75. The result is that, as before, when the end couplings 43 on the upwardly extending field cables 41 are electromechanically connected with fittings 81, the bending thereby induced in the lengths 42 of those cables in passageway 50 has a smallest bend radius which is greater than if fittings 81 were to be aligned wholly horizontal, and which smallest bend radius is greater than the minimum critical size at which a field cable would be damaged by bending it to that minimum radius.

The apparatus 9 therefor permits admittance thereto through either an upper entry way or a lower entry way of one or more field cables which are so stiff that they could not be electromechanically connected at their free ends in the apparatus with one or more fixedly aligned connectors therefor without undue ending of such one or more field cables when admitted through one or the other of such entry ways or both.

In connection with the foregoing, it is to be noted, that whether a field cable is admitted through upper or lower entry way 35 or 36 into passageway 50 in housing 10, the bending of that cable takes place in the longitudinal and vertical dimensions of that passageway so that, as is the case, the lateral extent of the passageway may be made smaller than its longitudinal extent to thereby economize on the lateral space taken up by the passageway in the housing.

Further in connection with the foregoing, while the apparatus 9 has been described as designed for use where the one or more field cables which serve it approach it either from above or below, the apparatus 9 also can be advantageously used where it must be served both by one or more field cables approaching it from above and one or more field cables approaching it from below. In that case, say, the rockable platform 100a would be secured at its first position to have the fittings 81 mounted thereof point upwards and be connected to field cables admitted into housing 10 through its upper entry way whereas a rockable platform 100 below platform 100a would be secured at its second position to have the fittings 81 mounted by it point downward and be connected to field cables admitted into housing 10 through lower entry way 36.

The above described embodiment being exemplary only, it is to be understood that additions thereto, omissions therefrom and modifications thereof can be made without departing from the spirit of the invention. Accordingly, the invention is not be considered as limited save as consonant with the recitals of the following claims.

I claim:

1. Apparatus comprising, a housing having a top, bottom and vertically extending sides disposed between said top and bottom and around an interior space in said housing, said housing having therein upper and lower entry ways each for admitting a field cable from outside to inside said housing so as to position in said space a length of said cable terminating in a free end thereof, container means in said space for holding equipment installed in said housing, cable extension means in said space comprising, a short flexible extension cable having rear and front ends and a central portion therebetween, and first and second cable fittings at said rear and front ends, respectively, of said cable and electromechanically coupled together by it, said first fitting being disposed at and fixedly mechanically coupled with said container means and electrically connectable to equipment therein, and said second fitting being displaced away from said first fitting and positionally adjustable in said space relative to said first fitting and electromechanically connectable with said free end of said field cable, and said apparatus further comprising mounting means disposed in said space and carrying said second fitting and adjustable between and securable at first and second positions of such mounting means at which said front end of said said short cable extends upwardly and downwardly, respectively, from said central portion of said short cable so as to facilitate coupling of said second fitting to said end of said field cable when the latter is admitted into said housing through, respectively, said upper entry way and said lower entry way.

2. Apparatus according to claim 1 in which said upper and lower entry ways are provided in, respectively, said top and bottom of said housing.

3. Apparatus according to claim 1 in which said field cable and said short flexible cable are coaxial cables and said first and second fittings are coaxial fittings.

4. Apparatus according to claim 1 in which said housing comprises a vertically upstanding framework and panels carried by said framework to provide enclosures for said interior space.

5. Apparatus according to claim 1 in which said vertically extending sides of said housing comprise a left side and right side horizontally spaced laterally from each other, at least portions of said upper and lower entry ways are disposed at said left side of said housing, said container means is vertically upstanding in said space and laterally spaced from said left side to provide in said space between said left side and said container means a passageway horizontally having lateral and longitudinal extents in said space and vertically extending between and communicating with both of said entry ways, said length of field cable being received in said passageway when such cable is admitted into said housing means, and said cable extension means being disposed in said passageway.

6. Apparatus according to claim 5 in which said passageway horizontally has a greater longitudinal extent than lateral extent.

7. Apparatus according to claim 5 in which said container means comprises a rectangular prismatic rack having a vertical side alongside of and facing towards said passageway to be opposite said left side of said housing, and in which said mounting means comprises; a bracket secured to said side of said rack and projecting laterally into said passageway, and a rockable platform carrying said second fitting and pivotally coupled to said bracket to be adjustable between said first and second positions by angular movement of said platform about a lateral axis.

8. Apparatus according to claim 7 in which said bracket comprises a backing which is provided for said platform and which is secured to such rack side and projects laterally therefrom into said passageway, said backing having therein an opening extending rearwardly through said backing, said platform is of "U" shape in lateral cross section and comprises, a central support web having a top and bottom and laterally opposite sides, and a pair of arms extending rearward from such web sides to said backing to be pivotally coupled thereto on laterally opposite sides of said opening and to hold said support web longitudinally forward of said backing, said web has formed therein an aperture aligned with said opening and passing rearward through said web, said second fitting is seated on said web forward of said aperture, and said short cable passes rearwardly from said second fitting through said aperture and opening to said first fitting.

9. Apparatus according to claim 8 in which said side of said rack alongside said passageway comprises a vertical wall forming part of said rack, said apparatus comprises a cable receptor connector secured to and passing through said wall and having a part projecting out from said wall into said passageway, and in which said first fitting is mechanically coupled with said rack by said projecting part of said connector.

10. Apparatus according to claim 8 in which angular movement of said platform to said first and second positions serves to dispose adjacent to said backing the top and bottom, respectively, of said support web, and in which said mounting means comprises means at the top and bottom of said web for fastening it to said backing when said top and bottom are respectively adjacent thereto to thereby permit selective securement of said platform at said first and said second positions thereof.

11. Apparatus comprising, a housing having a top, bottom and vertically extending sides disposed between said top and bottom and around an interior space in said housing, said sides comprising left and fight sides horizontally spaced laterally from each other, and said housing having therein upper and lower entry ways of which at least portions thereof are disposed at said left side of said housing, each of said entry ways being provided for admitting a field cable from outside to inside said housing so as to position in said space a length of said cable terminating in a free end thereof container means in said space for holding equipment when such equipment is installed in said housing, said container means being vertically upstanding in said space and having a left side laterally spaced from said left side of said housing to provide in said space between said two left sides a passageway vertically extending between and communicating with both of said entry ways, said passageway receiving therein said length of said field cable when the latter is admitted into said housing through one of said entry ways, and a short flexible extension cable disposed in said passageway and having rear and front ends and a central portion therebetween, said rear end being fixedly mechanically coupled to said side of said container means and being electrically connectable to said equipment when installed, and said front end of said short cable being mechanically connectable to said free end of said field cable and being adjustable in said passageway to permit mechanical coupling through said extension cable of said field cable to said side of said container means with an acceptably large bending radius of said length of field cable in said passageway when such field cable is admitted into said housing through either one of said upper and lower entry ways.

12. Apparatus comprising, an upstanding housing containing an interior space for accommodating electrical equipment in said housing, said housing having therein upper and lower entry ways each for admitting a field cable, for serving said equipment, from outside of to inside said housing so as to position in said space a length of said cable terminating in a free end thereof, a cable receptor connector fixedly positioned in said housing vertically between said two entry ways and electrically connectable to said equipment when the latter is installed in said housing, said free end of said field cable when in said space being electrically connectable to said receptor connector by providing in said space a short flexible extension cable and by mechanically coupling said free end of said field cable and said receptor connector to said extension cable at, respectively, a front end thereof and a rear end thereof separated from said front end by a central portion of said extension cable, and mounting means disposed in said space and providing a mounting for said front end of said extension cable when in said space, said mounting means being adjustable between and securable at first and second positions thereof at which said extension cable's front end, when mounted by said means and mechanically coupled to said free end of said field cable, extends upwardly and downwardly, respectively, from said central portion of said extension cable so as to permit mechanical coupling through said extension cable of said field cable to said receptor connector with an acceptably large bending radius in said space of said length of said field cable.

13. Apparatus according to claim 5 in which said upper and lower entry ways are provided in said housing for admitting a plurality of field cables from outside of to inside said housing so as to position in said passageway respective lengths of said field cables terminating in respective free ends thereof, and in which said apparatus comprises; a plurality of said short flexible extension cables comprising said first named extension cable and at least one other extension cable, said plurality of extension cables being disposed in said passageway for coupling said plurality of field cables to said container means, and a plurality of mounting means comprising said first named mounting means and at least one other mounting means, said plurality of mounting means being disposed in said passageway to cooperate with said plurality of extension cables to further coupling said plurality of field cables to said equipment when installed in said container means.

14. Apparatus comprising, a vertically upstanding container for telecommunications equipment, a flexible extension cable having a front end disposed outside said container and running from said front end to a rear end of said able adjacent said container and electrically connectable with said equipment when installed, a fitting on and coupled to said extension cable at said front end thereof and electromechanically connectable with an end coupling on an external cable for serving said equipment, and mounting means disposed adjacent said container and having mounted thereon said fitting, said mounting means being selectably adjustable to, and securable at, first and second positions thereof at which said mounted fitting points upwardly, and downwardly, respectively.

* * * * *